United States Patent
Sato et al.

(10) Patent No.: US 6,821,801 B1
(45) Date of Patent: Nov. 23, 2004

(54) MANUFACTURING METHOD OF SEMICONDUCTOR LASER DIODE

(75) Inventors: Hiroshi Sato, Kokubunji (JP);
Tomonobu Tsuchiya, Hachioji (JP);
Masahiro Aoki, Kokubunji (JP);
Takeshi Kitatani, Hino (JP); Noritsugu Takahashi, Kokubunji (JP)

(73) Assignees: Hitachi, Ltd., Tokyo (JP); OpNext Japan, Inc., Kanagawa (JP)

( * ) Notice: Subject to any disclaimer, the term of this patent is extended or adjusted under 35 U.S.C. 154(b) by 4 days.

(21) Appl. No.: 10/777,071

(22) Filed: Feb. 13, 2004

(30) Foreign Application Priority Data

Nov. 12, 2003 (JP) ........................................ 2003-382026

(51) Int. Cl.⁷ .......................... H01L 21/00; H01L 21/20
(52) U.S. Cl. .......................................... 438/22; 438/41
(58) Field of Search ...................... 438/21–47, 479–509

(56) References Cited

U.S. PATENT DOCUMENTS

| 5,770,471 A | * | 6/1998 | Nagai | 438/31 |
| 5,854,089 A | * | 12/1998 | Nakatsu | 438/41 |
| 5,998,231 A | * | 12/1999 | Yamamoto | 438/41 |
| 6,103,542 A | * | 8/2000 | Pomp et al. | 438/40 |
| 6,200,826 B1 | * | 3/2001 | Kim | 438/31 |
| 6,518,076 B2 | * | 2/2003 | Hosoda | 438/22 |
| 6,518,159 B1 | * | 2/2003 | Tsunoda | 438/604 |

FOREIGN PATENT DOCUMENTS

| JP | 10-335756 | 6/1997 |
| JP | 2001-102355 | 7/2000 |
| JP | 2003-78213 | 9/2001 |

OTHER PUBLICATIONS

M. Aoki et al., "85° C–10Gbit/s Operation of 1.30 $\mu$m InGaAlAs MQW–DFB Laser", 26th European conference (ECOC2000), vol. 1, 2 pages.

P.J.A. Thijs et al., "High Performance Buried Heterostructure $\lambda$=1.5 $\mu$m InGaAs/AlGaInAs Strained–Layer Quantum Well Laser Diodes", International Conference on Indium Phosphide and Related Materials, Conference Proceedings 1996, pp. 765–768.

K. Shinoda et al., "Highly Reliable InGaAsP/InP Lasers with Defect–Free Regrowth Interfaces formed by Newly Composed HBr–Based Solutions", 2001 IEEE, 2001 International Conference on Indium Phosphide and Related Materials, pp. 409–412.

D. Bertone et al., "High Reliability, High Yield, High Modulation Bandwidth, Low Threshold Current 1.55 $\mu$m MQW Laser by New In–Situ Etching Technique", 24th European Conference on Otpical Communication (ECOC 1998) Proceedings, vol. 1, pp. 75–76.

* cited by examiner

Primary Examiner—Savitri Mulpuri
(74) Attorney, Agent, or Firm—Reed Smith, LLP; Stanley P. Fisher, Esq.; Juan Carlos A. Marquez, Esq.

(57) ABSTRACT

The invention provides a manufacturing method of a laser diode having buried grown layer with less crystal defects and with low consumption power and having high reliability in a buried heterostructure laser diode using an InGaAlAs type material as an active layer, by preventing the inhibition of burying and regrowing of the active layer caused by oxidation of Al contained in the active layer.

A manufacturing method of a semiconductor laser diode and the active layer comprises a material at least containing Al and having a buried hetero-cross sectional structure, formation of the buried heterostructure, comprising the steps of fabricating the active layer into a stripe shape or mesa shape by etching including at least wet etching, cleaning the stripe-shape sidewall of the core layer with a gas containing chlorine or other halogen element in a crystal growing apparatus and burying the active layer in the semiconductor.

15 Claims, 11 Drawing Sheets

MANUFACTURING METHOD OF SEMICONDUCTOR LASER DIODE

BACKGROUND OF THE INVENTION

1. Field of the Invention

The present invention relates to a manufacturing method of a buried heterostructure semiconductor laser diode and, more in particular, it relates to a burying-regrowing technique of an InGaAlAs type active layer to attain high reliability for long time operation in a buried heterostructure semiconductor laser diode using an InGaAlAs type material for the active layer.

2. Description of the Related Art

Along with increasing use of information communication services, operation communication speed has been made higher and the capacity has been increased in optical communication systems supporting the services. In particular, optical communication equipment having a communication speed of about 10 Gbits per second (10 Gbit/s) has been introduced rapidly not only to public networks such as long distance trunk communication systems or megalopolis communication systems but also to the vicinity of common users such as the Ethernet (registered trade mark). As the high-speed optical communication systems have been extended as far as the vicinity of the users, small-sized and inexpensive optical communication equipments for 10 Gbit/s use have been demanded.

Referring to the optical transmission equipment, an optical module and a light source capable of direct modulation at a high speed of about 10 Gbit/s with no temperature control has been demanded strongly for attaining size reduction and cost reduction. To cope with this demand, semiconductor laser diodes using an InGaAlAs type material for an active layer have been under development as laser diodes that operate at a high-speed of about 10 Gbit/s in a wide temperature range from low temperatures to high temperatures. The structure of the InGaAlAs type laser diodes predominant in the development so far has been of an optical ridge waveguide type because of simple and convenient structure. For example, details are described in "26th European Conference on Optical Communication (ECOC2000) Proceedings", Vol. 1, p. 123, or the like.

To maximize the utilization of the high-speed characteristics of the laser diode using the InGaAlAs type material as the active layer, it is desirable to introduce a buried heterostructure capable of intensely confining carriers in the horizontal direction. However, in the laser diode using the InGaAlAs type material, since crystal regrowing for burying the active layer with the semiconductor is inhibited by oxidation of Al contained in the active layer, formation of the buried heterostructure is not easy. Al oxides formed in the sidewall of the active layer cause crystal defects in the buried grown layer. The crystal defects cause deterioration of device characteristics and, in the long time device operation, the device characteristics are gradually degraded due to the increase of crystal defects. Therefore, in the buried heterostructure laser diode using the InGaAlAs type material, device reliability for a long time at a practical level has not yet been attained. For example, as described in International conference on Indium Phosphide and Related Materials 1996, Conference Proceedings 1996, pp 765–768, it has been reported in the aging test that operation characteristics are degraded along with long time current supply in a buried heterostructure laser diode using the InGaAlAs type material as the active layer.

To attain the high reliability of such an InGaAlAs type buried heterostructure laser diode, several reports have been presented for the surface cleaning technique in a burying process for a semiconductor laser diode. However, not a few subject have been still left in each of known examples. For example, there can be mentioned JP-A No. 2001-102355 as a first known example. This known example proposes a process of forming a mesa stripe for an Al type active layer by wet etching in a semiconductor laser diode having the active layer and applying a surface treatment with a solution formed by mixing hydrogen fluoride and ammonium fluoride solution. In this process, since the solution treatment is performed, Al on the sidewall of the active layer is oxidized by residual water contained in the solution. Thus, this cannot be said to be a satisfactory method of suppressing oxidation.

Further, in JP-A No. 10-335756 as a second known example, a treatment with chlorine type gas is applied to a mesa stripe formed by dry etching without wet etching treatment. In a case where the mesa stripe is formed by dry etching as in this example, it is necessary to remove damage to the crystal surface caused by dry etching by an appropriate wet etching. Its details are described, for example, in 2001 International Conference on Indium Phosphide and Related Materials, Conference Proceedings 2001, pp 409. Accordingly, also in the case of using the dry etching for the mesa stripe formation step in an InGaAlAs type BH laser diode, wet etching is necessary after dry etching for attaining high reliability.

Further, a technique of forming the mesa stripe of the active layer only with a chlorine type treatment in a crystal growing apparatus has been reported in "24th European Conference on Optical Communication (ECOC 1998) Proceedings" 1998, Vol. 1, pp 75 as a third known example. However, a significant subject remains in applying the reported technique to the InGaAlAs type BH laser diode. At first, since this is etching in a gas phase, the etching depth is restricted. As a result, this involves a subject for the formation of the BH structure at a practical level such that the current blocking layer on both sides of the active layer cannot be increased sufficiently in thickness. Secondly, in a case where the InGaAlAs type material is used for the active layer, it is difficult to perform gas phase etching on the InGaAlAs type material, which brings about a problem, for example, that the crystal surface is roughened by long time etching. To form a desirable mesa stripe as the BH laser diode, it requires not only the gas phase etching in the crystal growing apparatus but also an etching technique such as wet etching on the outside of the crystal growing apparatus.

SUMMARY OF THE INVENTION

To attain high reliability in long time operation in a buried heterostructure semiconductor laser diode using the InGaAlAs type material as the active layer, the present invention proposes the following manufacturing method as the burying regrowing technique of the InGaAlAs type active layer. Specifically, the method comprises a series of steps including a step of wet etching an active layer comprising an InGaAlAs type material in a mesa stripe shape, a cleaning treatment for the buried regrown surface with a chlorine type gas in a crystal growing apparatus, a step of burying the active layer in contiguous with the cleaning treatment. By cleaning with the chlorine type gas in the crystallizing apparatus, burying-regrowing is possible in a state of removing an oxide layer formed on the sidewall of the active layer. Unlike the solution treatment as described in the first known example, since the residual water content and the concentration of oxygen in the crystal growing apparatus are sufficiently low, more clean boundary can be obtained. Further, since wet etching is applied to the mesa formation, damage due to plasma as in dry etching can be avoided unlike the second known example. Further, since the wet etching undergoes no restriction for the mesa depth, the structure that cannot be realized by the third known example can be realized by the application of the invention. The gas used for removing the oxide is preferably a gas containing a halogen element such as hydrogen chloride (HCl), methyl chloride ($CH_3Cl$), carbon tetrachloride ($CCl_4$) and carbon tetrabromide ($CBr_4$). Since impurities such as Al oxide on the sidewall of the active layer are removed by the gas containing the halogen element, growth of the buried semiconductor layer is not inhibited. As a result, occurrence of crystal defects to the buried semiconductor layer can be minimized to outstandingly improve the characteristics and the long time reliability of the semiconductor laser diode. The surface treatment by the chlorine type gas does not excite the gas by plasmas, etc., unlike the existent dry etching. Accordingly, the crystal surface can be cleaned with no plasma damage, etc. as worried for the dry etching.

As has been described above, the reliability of the BH laser diode using the InGaAlAs type material for the active layer can be attained only by combination of a series of steps, namely, at least wet etching, cleaning treatment in the crystal growing apparatus, and burying growing contiguous thereto.

The invention can provide a buried heterostructure laser diode that uses the InGaAlAs type material for the active layer, which uses less threshold value current and has high reliability.

BRIEF DESCRIPTION OF THE DRAWINGS

Preferred embodiments of the present invention will be described in details based on the drawings, wherein.

DESCRIPTION OF THE PREFERRED EMBODIMENT

<Embodiment 1>

A description will be made of a Fabry-Pelot laser diode with a wavelength band of 1.3 $\mu$m according to Embodiment 1 of the present invention.

Figure 3:
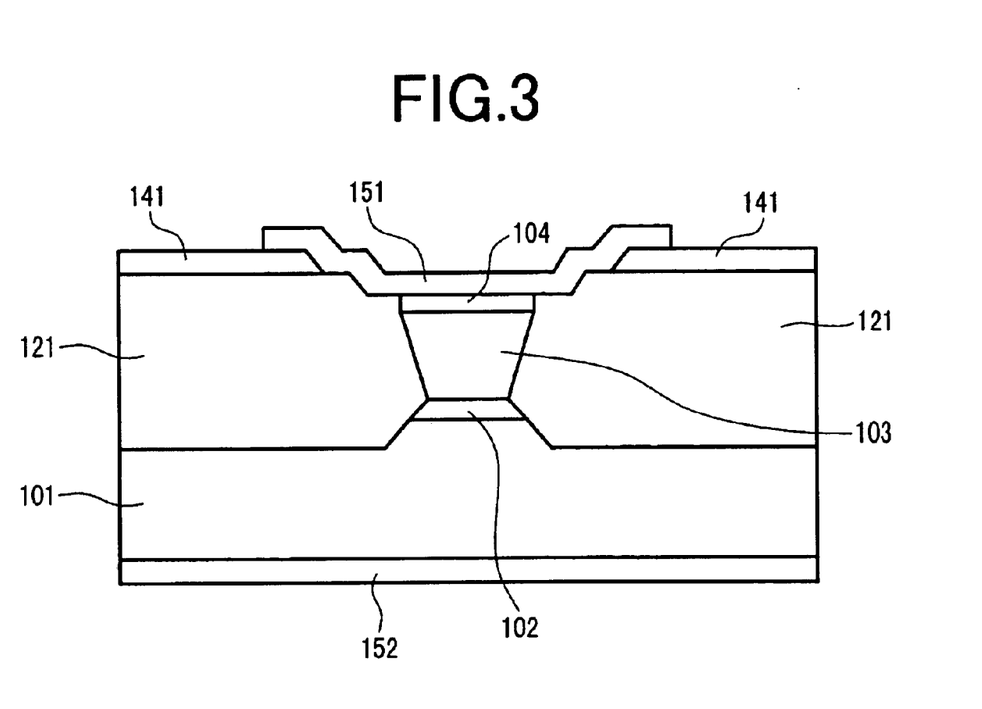
FIG. 3 is a cross-sectional view of a device according to Embodiment 1 of the invention.

FIG. 3 is a cross-sectional view of the laser diode according to Embodiment 1 of the invention. On an n-InP substrate 101, are successively formed a multi-layered structure of an active layer 102, a p-InP cladding layer 103, and a p-InGaAs layer 104. For the crystal growing of the multi-layered structure, MOVPE (Metal organic Vapor Phase Epitaxy) is used. The active layer 102 comprises an InGaAlAs type MQW (Multiple Quantum Wells) with its light emission wavelength set to 1300 nm. A semi-insulative Fe-added InP 121 is buried on both sides of the active layer. The steps of forming the BH (Buried Heterostructure) are shown in FIG. 4A to FIG. 4D.

Figure 4A:
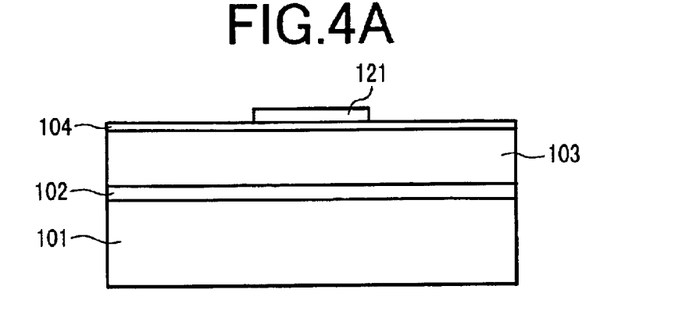
FIGS. 4A, 4b, 4C and 4D are diagrams showing manufacturing steps for the device according to Embodiment 1 of the invention.
Figure 4B:
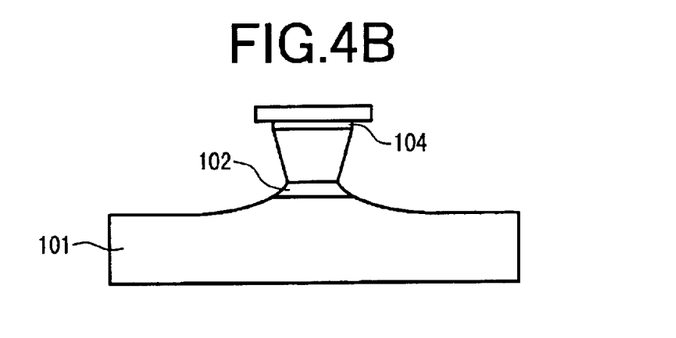
Figure 4C:
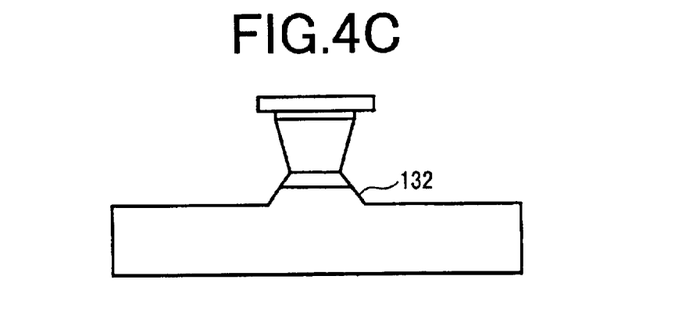

Using silicon oxide ($SiO_2$) as a mask 131, the active layer is fabricated into a stripe shape on the wafer formed with the multi-layered structure (FIG. 4B). The mesa-stripe is formed by etching using a solution containing bromine ($Br_2$). The etching depth is about 3 $\mu$m and the width of the active layer is 1.5 $\mu$m. The wet-etched wafer is introduced into a reactor of an MOVPE system, the temperature of the substrate is elevated up to 600° C., and the wafer surface is cleaned with a hydrogen chloride (HCl) gas. In the cleaning step, the (111)B facet 132 is exposed to sidewalls below the active layer. Successive to the cleaning step, the active layer is buried in an Fe-doped high resistance InP 121.

Figure 4D:
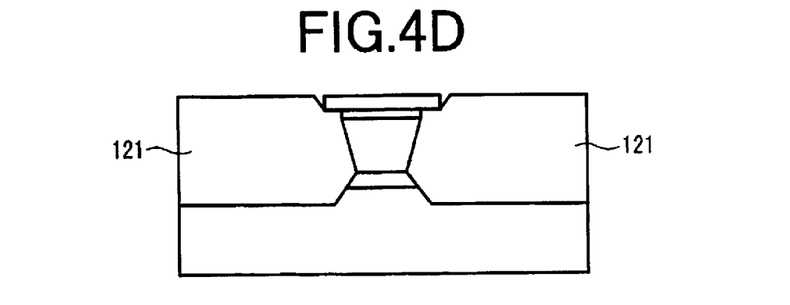
Figure 5:
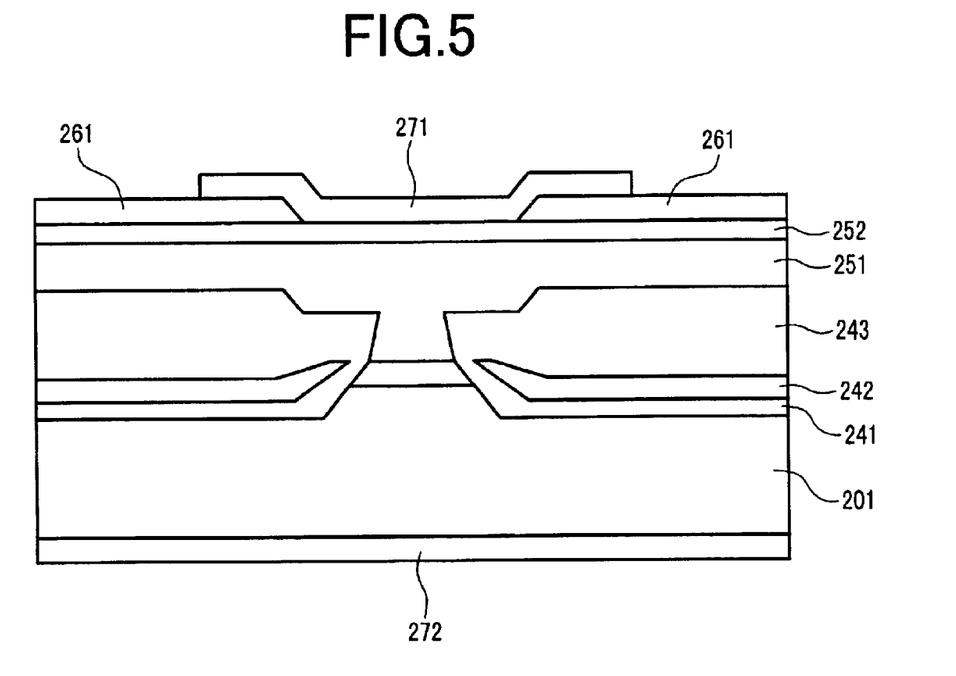
FIG. 5 is a cross-sectional view of a device according to Embodiment 2 of the invention.

Subsequently to the burying and growing of the active layer, the wafer surface is subjected to an insulating treatment with silicon oxide (hereinafter simply referred to as $SiO_2$) 141. The insulative film is removed for current supply in the upper portion of the ohmic contact layer 104 to form a p-side electrode 151. The p-side electrode may be formed by successively layering Ti, Pt, and Au, which are known materials. Subsequently to the formation of the p-electrode, the wafer is polished to as thin as about 100 $\mu$m to form an n-side electrode 152. The n-side electrode has a known structure in which after vapor depositing an AuGe alloy and Ni, Ti, Pt, and Au are layered thereon. After forming the electrode, the device is cleaved to a desired length and high reflective film 125 is formed on the rear end face and a low reflective film 126 is formed over the entire surface. In the formation of the end face reflective film, the end face may be covered so as to obtain a desired reflectivity by using known materials such as $AlO_x$, $SiO_2$, SiN, a-Si and the like.

Figure 1:
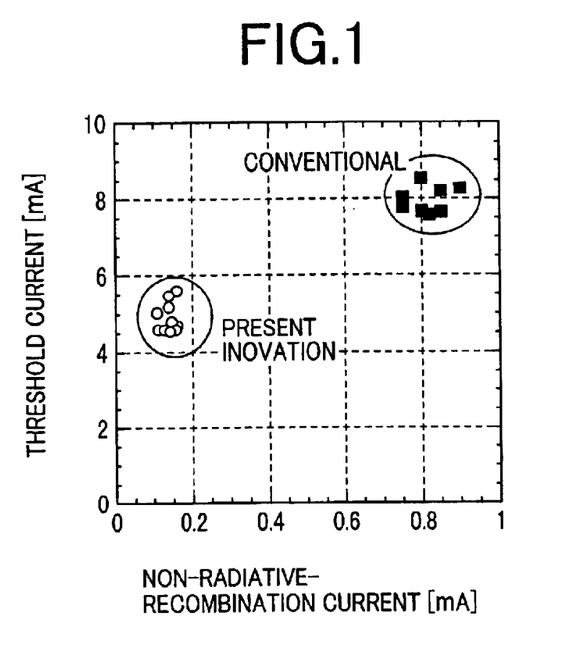
FIG. 1 is a diagram for explaining the effect of the invention.
Figure 2:
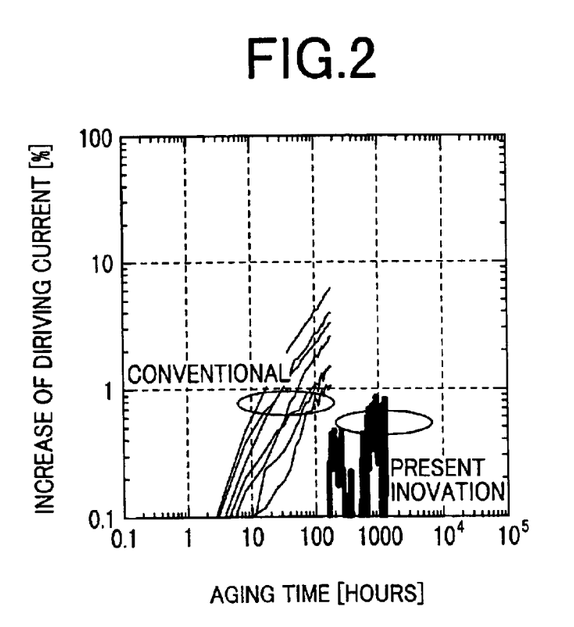
FIG. 2 is a diagram for explaining the effect of the invention.

As the demonstration of the superiority of the cleaning applied in this embodiment, FIGS. 1 and 2 show the effect in the case of a BH laser diode formed by a known solution treatment and in a case of applying cleaning in the crystal growing apparatus shown in this embodiment. FIG. 1 shows a relation between a non-radiative-recombination current not contributing to laser diode oscillation and a threshold current. Apparently, smaller non-radiative-recombination current is more preferred. As shown in FIG. 1, the value of the non-radiative-recombination current obtained by the application of the present invention is reduced to ¼ or less of the known technique. The reduced non-radiative-recombination current is at the same level as that in the InGaAsP type laser diode, which is known to have high reliability. It can be seen that the threshold current is also decreased with the decrease of the non-radiative-recombination current. FIG. 2 shows the change of the driving current in a long-time reliability test for the InGaAlAs type BH laser diode. In the InGaAlAs type BH laser diode formed by applying known technique thereto, the driving current is increased by about 1% for an aging time of about 100 hours. On the contrary, in a case of applying the invention, fluctuation of the driving current of the BH laser diode is suppressed to 1% or less even after current supply for 1000 hours or more. The facts described above show that occurrence of crystal defects is suppressed during burying growth of the active layer by the application of the invention and show that the invention is indispensable for attainment of the reliability in the InGaAlAs type BH laser diode.

Characteristics and reliability of the InGaAlAs type BH laser diode are improved by the manufacturing steps shown in this embodiment.

The life estimated from the result shown in FIG. 1 is ten times or more compared with the case of not applying the treatment with the hydrogen chloride gas and it reaches 100,000 hours, which is a practical level. In this embodiment, while hydrogen chloride is used for the surface cleaning before burying and growing of the active layer, the gas used for surface cleaning is not restricted only to hydrogen chloride but similar effect can also be obtained by using methyl chloride ($CH_3Cl$) or a $CBr_4$ gas.

Further, while the Fabry-Pelot laser diode is adopted in this embodiment, this technique can be applied easily also to a DFB (Distributed Feedback) type laser diode. Further, also for the wavelength band, it is not restricted only to the 1300 nm band but it is applicable also to an infrared light source of 1550 nm band.

<Embodiment 2>

FIGS. 5, 6A to 6E show Embodiment 2 of the invention having a structure derived from Embodiment 1. This embodiment shows a laser diode in which a buried heterostructure is formed by a two-stage burying step.

Figure 6A:
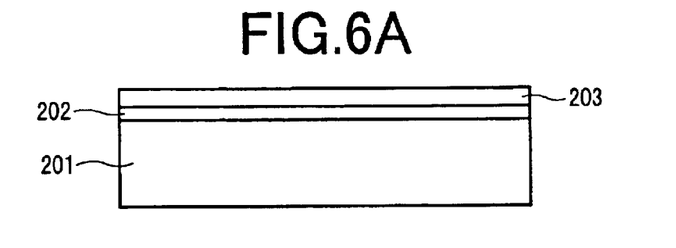
FIGS. 6A, 6B, 6C, 6D and 6E are diagrams showing manufacturing steps for the device according to Embodiment 2 of the invention.

At first, in a first crystal growing step, an active layer 202 and an n-InP cladding layer 203 are formed on a p-InP substrate 201. The active layer comprises an InGaAlAs type MQW structure with its light emission wavelength set to 1300 nm.

Figure 6B:
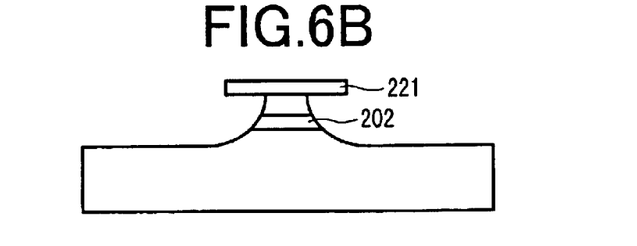
Figure 6C:
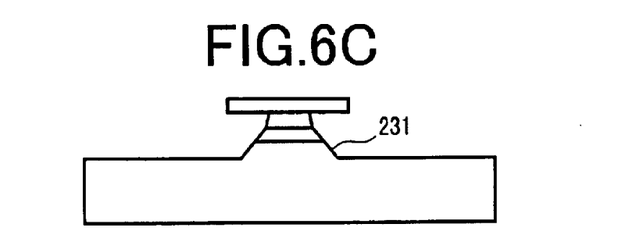
Figure 6D:
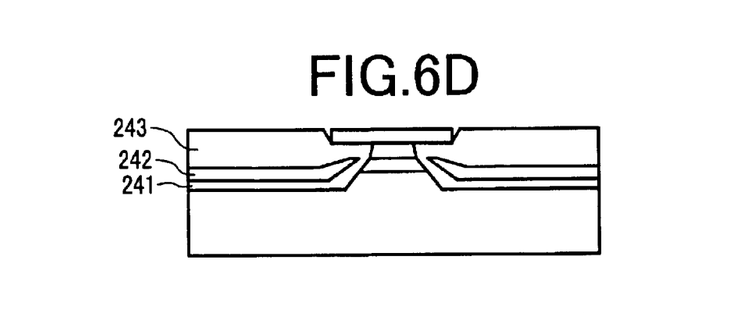

After forming the multi-layered structure, as shown in FIG. 6B, the active layer is fabricated into a stripe shape using silicon oxide ($SiO_2$) as a mask 221. To form the mesa stripe, wet etching by an aqueous solution mainly comprising a mixed aqueous solution of hydrobromic acid and aqueous hydrogen peroxide is used. The width of the active layer is set to 1.5 $\mu$m so as to attain a single lateral mode oscillation. After forming the mesa stripe by the wet etching, the wafer is cleaned in the MOVPE apparatus by using a hydrogen chloride (HCl) gas. A (111)B facet 231 was exposed on the mesa sidewall through the cleaning step. In contiguous with the cleaning step, a buried structure is formed by a second crystal growing step. The buried layer is formed by successively layering a p-InP 241, n-InP 242 and a p-InP 243 to block current. In the same manner as in Embodiment 1, the gas used for the surface cleaning before burying and growing is not restricted to hydrogen chloride but it may also be methyl chloride or the like.

Figure 6E:
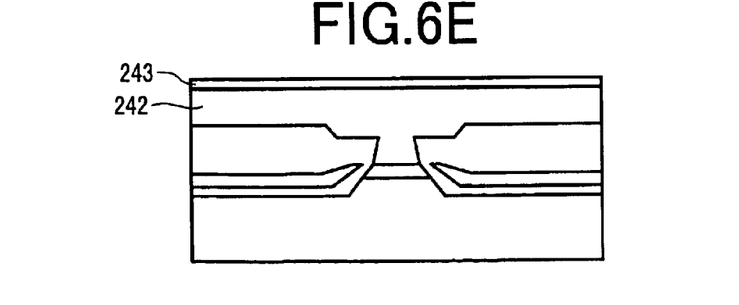

In a third crystal growing step, an n-InP as a cladding layer 251 and an n-InGaAsP as an electrode ohmic contact layer 252 are layered on each other. After completing the-third crystal growth, a silicon oxide ($SiO_2$) film 261 is formed for insulation and a device is formed through the step of forming an n-electrode 271 and a p-electrode 272.

<Embodiment 3>

Figure 7:
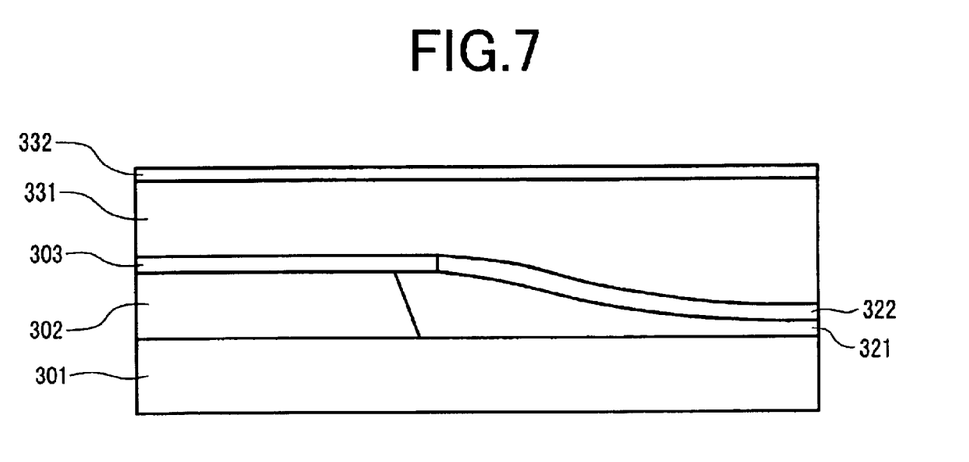
FIG. 7 is a cross-sectional view of a device according to Embodiment 3 of the invention.

Embodiment 3 of the invention applicable to an integration waveguide in the light propagating direction is described. FIG. 7 shows a device structure in which an InGaAlAs type and an InGaAsP type spot-size converter optical waveguide are integrated.

Figure 8A:
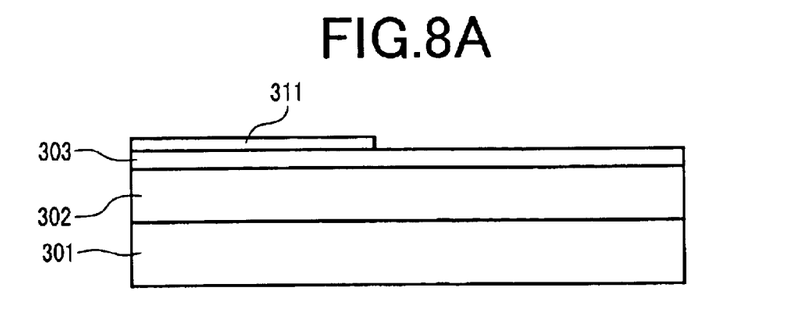
FIGS. 8A. 8B, 8C and 8D are diagrams showing manufacturing steps for the device according to Embodiment 3 of the invention.

In a first crystal growing step, a multi-layered structure as an optical waveguide is formed on a p-InP substrate 301. Specifically, an active layer 302 and a p-InP cladding layer 303 are formed successively as a core layer. The active layer 302 comprises an InGaAlAs type MQW structure with an oscillation wavelength set to 1300 nm.

Figure 8B:
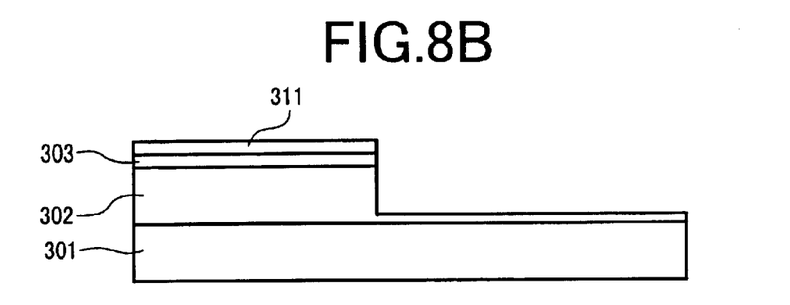
Figure 8C:
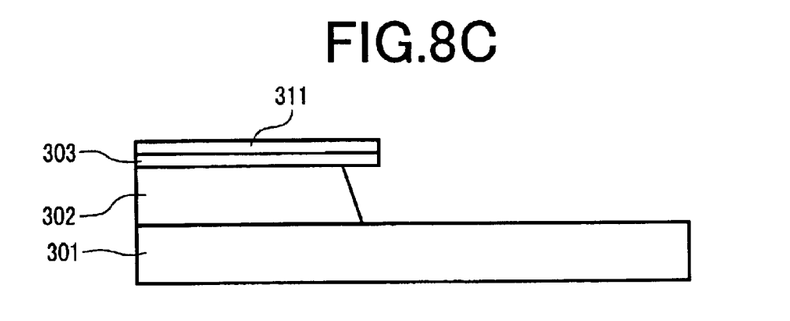

After forming the multi-layered structure described above, a silicon nitride (hereinafter simply referred to as SiN) film 311 is covered as a protection mask on the active region of the multi-layered structure. Using the SiN mask, the active layer is selectively removed by etching as shown in FIGS. 8B and 8C. For example, etching can be stopped at the p-InP substrate 301 by the combined use of dry etching, for example, by ICP (inductive coupled plasma) and a selective wet etching using a solution comprising phosphoric acid or sulfuric acid as a main ingredient.

Figure 8D:
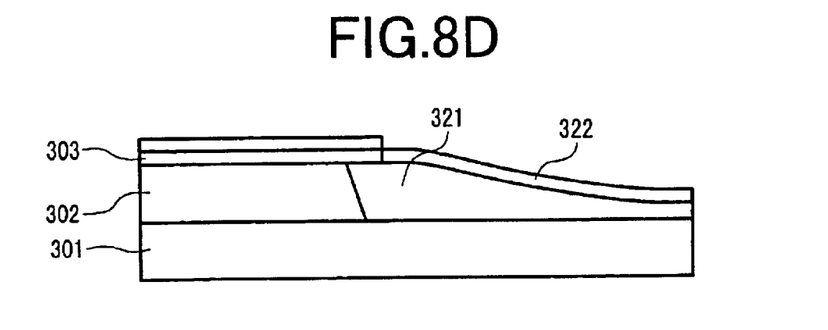

After removing the GaAlAs type active layer, the surface is cleaned with a hydrogen chloride gas in an MOCVD apparatus, and a tapered optical waveguide 321, comprising an InGaAsP type material and an InP cladding layer 322, are layered. If the treatment by the hydrogen chloride gas is not performed in the MOCVD apparatus, since oxides remained on the surface of the InGaAlAs active layer inhibit growth of the InGaAsP crystals, voids are formed at a connection portion between the InGaAlAs type crystals and the InGaAsP optical waveguide. Further, the technique for forming the tapered optical waveguide 321 is known and since this is not the gist of the invention, detailed descriptions are to be omitted.

After integrating the tapered optical waveguide 321, a buried heterostructure is formed. The step of forming the buried heterostructure is the same as the step described already in Embodiment 2. After removing the SiN film 311 used for butt joint, the active layer and tapered optical waveguide may be etched into stripes to form a BH structure. Detailed descriptions of the BH structure are to be omitted.

In Embodiment 3, while the laser diode and the tapered optical waveguide are integrated but the technique of connecting the optical waveguide explained above may also be applied to other integrated optical waveguides. For example, as is known, integration of the optical waveguide by the butt joint has been adopted also in EA (Electro Absorption) modulator integrated laser or DBR (Distributed Brag Reflector) laser and the invention is applicable also to such optical. In the EA modulator integrated laser diode, it is possible to integrate the DFB laser diode comprising the InGaAlAs type material and the EA modulator comprising the InGaAlAs type material in the direction of the optical axis. As a result, the InGaAlAs type material can be selected as the constituent material for the DFB laser section and the EA modulator, and this can provide excellent current/optical output characteristics and optical modulation characteristics not found in the existent InGaAsP type material.

<Embodiment 4>

Embodiment 4 of the invention applicable to the formation of a gain coupled type DFB laser diode will be described with reference to FIG. 9. FIG. 9 is a cross-sectional side elevation of an optical waveguide of a gain coupled type FB laser diode.

Figure 9A:
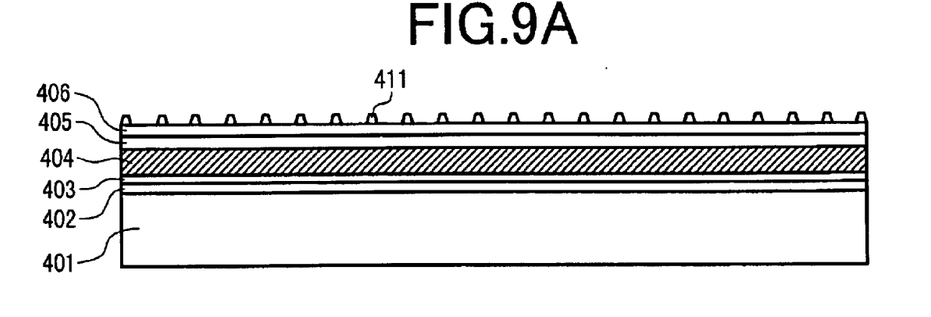
FIGS. 9A, 9B, 9C and 9D are cross-sectional views of a device according to Embodiment 4 of the invention.
Figure 9B:
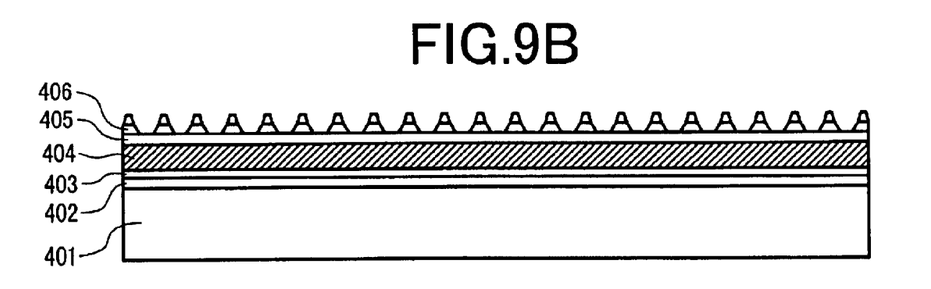

In a first crystal growing step, on a p-InP substrate 401, are successively formed a p-InAlAs layer 402, a p-InGaAlAs light confining layer 403, an InGaAlAs type MQW active layer 404, an n-InGaAlAs light confining layer 405, and an n-InP cladding layer 406.

Diffraction gratings with a period of 200 nm are formed in the wafer formed with the layered structure described above. The gratings are formed, in the same manner as in the known art, by the formation of a resist pattern by holographic interference exposure or electron beam drawing and wet etching. The InP type cladding layer 406 is etched by wet etching using a resist pattern 411 formed by holographic interference exposure as a mask. As shown in FIG. 7B, after etching the n-type InP cladding layer grating-wise, the resist on the surface is removed.

Figure 9C:
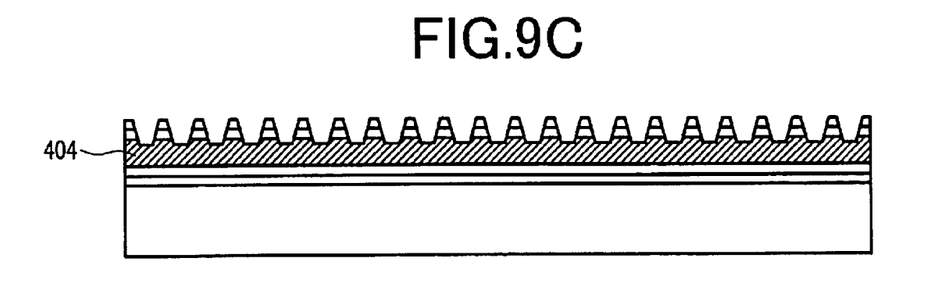
Figure 9D:
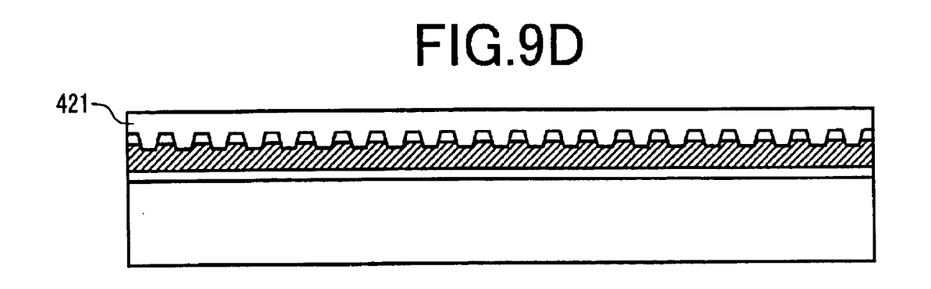

After peeling the resist from the surface, gratings are formed on the n-InGaAlAs optical confinement layer 405 and the MQW active layer 404 by a solution that selectively etches the InGaAlAs type material. The wafer in which the gratings were formed to the MQW active layer is introduced into the MOVPE apparatus and the surface is cleaned with a hydrogen chloride gas. In contiguous with the cleaning in the MOVPE apparatus, n-InP cladding layer is formed as a second crystal growing step. For the cleaning of the InGaAlAs crystal surface, it is also possible to use methyl chloride ($CH_3Cl$) or the like in addition to hydrogen chloride. After forming the n-InP cladding layer 421, a BH structure is formed by the same step as in Embodiment 2 of the invention. Since the step of forming the BH structure overlaps with that in Embodiment 2, detailed descriptions will be omitted.

The DFB structure in which the gratings are formed directly to the active layer provides gain-coupled gratings whose gain change periodically along with the reflective index of the optical waveguide. The gain-coupled type DFB laser diode shows excellent mode selectivity or resistivity to optical feedback as has been known already in the laser diode using the InGaAsP type material. Excellent mode selectivity and resistivity to optical feedback are important factors for making full use of excellent high-speed characteristics of the InGaAlAs type active layer.

<Embodiment 5>

Figure 10A:
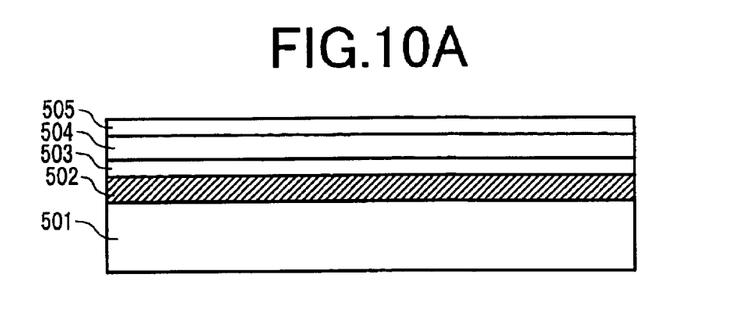
FIGS. 10A, 10B, 10C and 10D are cross-sectional views of a device according to Embodiment 5 of the invention.
Figure 10B:
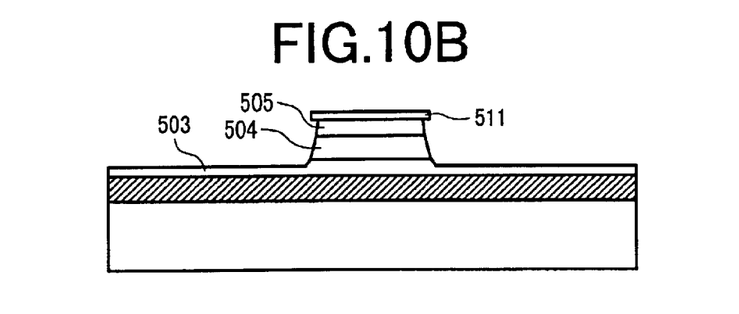
Figure 10C:
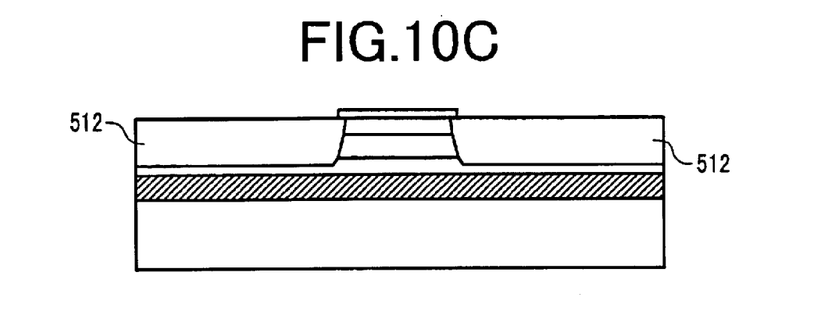
Figure 10D:
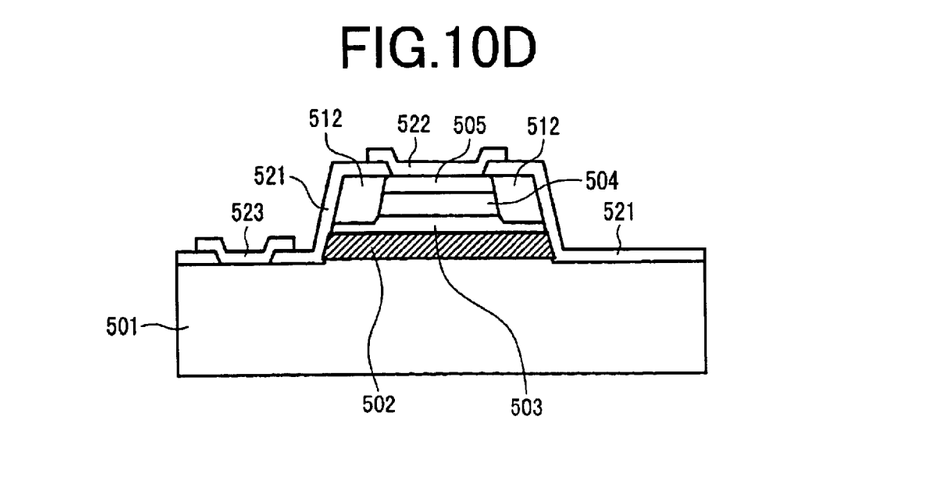
Figure 11:
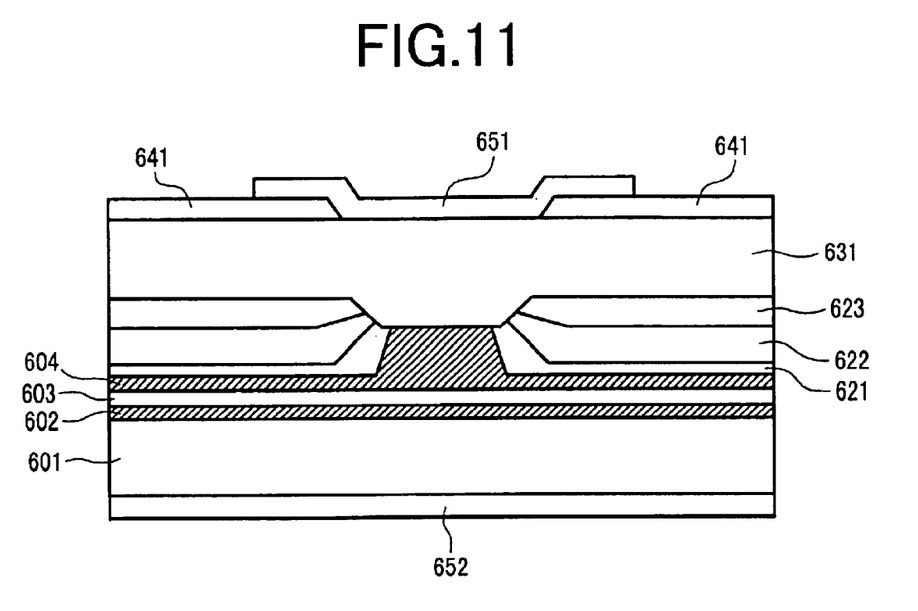
FIG. 11 is a cross-sectional view of a device according to Embodiment 6 of the invention.

Embodiment 5 of the present invention applicable to an APD (Avalanche Photo Diode) will be described with reference to FIG. 10. On an n-InP 501, are successively layered an n-InAlAs multiplication layer 502, a p-InAlAS field effect moderation layer 503, a p-InGaAs light absorption layer 504, and a p-InGaAs ohmic contact layer 505. The multi-layered structure is formed by an MBE (Molecular Beam Epitaxy) method. After crystal growing, a mask 511 is formed from silicon oxide ($SiO_2$) and the light absorption layer is etched into a mesa shape (FIG. 10B). The InAlAs 503 as the electric field moderation layer is exposed on the mesa-formed wafer surface. To bury the etched mesa in a semi-insulating semiconductor, the exposed surface of InAlAs 503 is cleaned. In the same manner as in the embodiment described above, subsequently to cleaning by the hydrogen chloride gas in the MOVPE apparatus, mesa is buried in the semi-insulating InP. After burying the mesa in the semi-insulating InP 512, the outer circumference of the mesa is etched leaving the buried layer 512 around the mesa for forming a guard ring. After etching the outer periphery of the mesa, the device is completed through the formation of a surface insulative film 521, a p-electrode 522, and an n-electrode 523. Since the steps described above have no difference from those of the known art, detailed descriptions are to be omitted.

<Embodiment 6>

Embodiment 6 of the present invention applicable to the step of forming a buried optical ridge waveguide laser diode with a wavelength band of 650 nm will be described with reference to FIGS. 11, 12A to 12D.

Figure 12A:
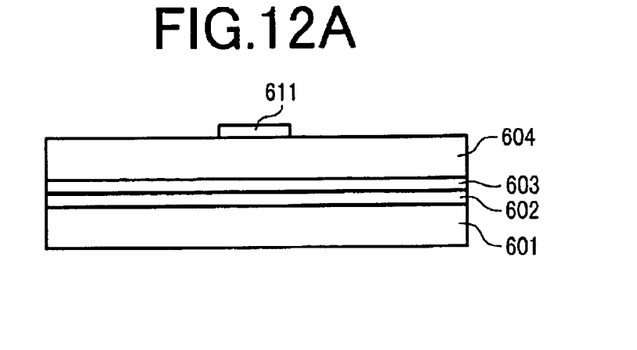
FIGS. 12A, 12B, 12C and 12D are diagrams showing manufacturing steps for a device according to Embodiment 6 of the invention.
Figure 12B:
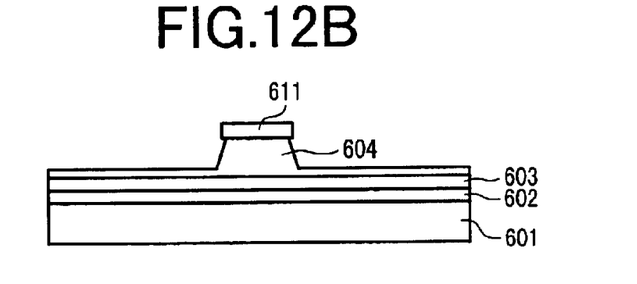

On an n-GaAs 601, are successively layered an n-AlGaInP cladding layer 602, an active layer 603, and a p-AlGaAlP cladding layer 604. The active layer comprises an MQW structure of GaInP and AlGaInP. The multi-layered structure is formed by the MOVPE method. After crystal growth, a mask 611 is formed from silicon oxide ($SiO_2$) and the p-AlGaInP optical waveguide 603 is etched in a convex shape (hereinafter simply referred to as ridge) (FIG. 12B). To form a ridge, dry etching using ICP and wet etching using HCl are used in combination. The wafer formed with the ridge on the surface thereof is introduced into the MOVPE apparatus and the wafer surface is cleaned by a hydrogen chloride gas. In the same manner as in the embodiment described above, a current blocking structure is formed successive to cleaning by the hydrogen chloride gas in the MOVPE apparatus. The current blocking structure is formed by layering three layers of an n-AlInP layer 621, an n-GaAs layer 622, and a p-GaAs layer 623 (FIG. 12C).

Figure 12C:
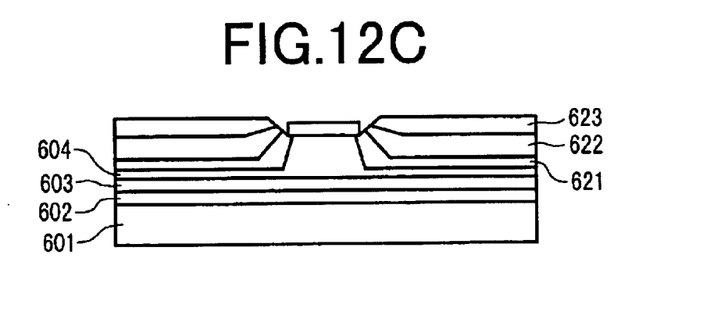

As is known, in the structure of FIG. 12C, the reflective index of the AlGaInP cladding layer 604 at a portion corresponding to the ridge portion is higher than the reflective index of each of the current blocking layers 621, 622, and 633 burying the periphery. As a result, a reflective index distribution is formed in the horizontal direction and the ridge portion is formed as an optical guide.

Figure 12D:
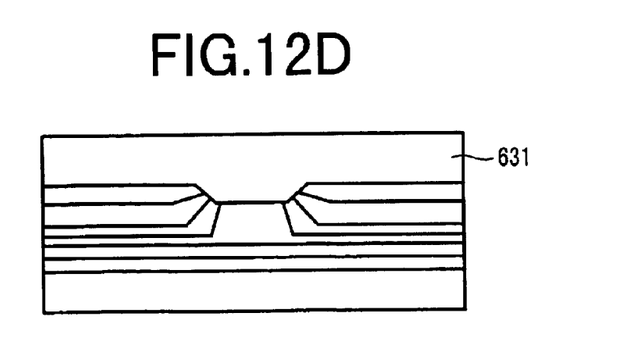

After forming the current blocking layer, the silicon oxide film 611 is removed, and a p-GaAs ohmic contact layer 631 is layered as a second burying step. After layering the layers described above, the device is completed through formation of a surface insulative film 641, and formation of a p-electrode 651 and an n-electrode 652.

Unlike Embodiments 1 and 2, the sidewall of the active layer is not cleaned directly in this embodiment. However, in the step of etching the p-AlGaInP cladding layer 604 containing Al in a ridged shape and burying the periphery with GaAs, it is necessary to clean the sidewall of the p-AlGaInP cladding layer. In a case where GaAs is buried while leaving oxide to AlGaInP, this would bring about deterioration of crystallinity at the boundary to cause deterioration of device characteristics and reliability.

As has been described above, the present invention is applicable not only to an optical source with an infrared wavelength region for communication use using InP as a substrate but also to a visible light source using GaAs as a substrate.

What is claimed is:

1. A manufacturing method of a semiconductor optical device comprising the steps of:

forming a layered film in which a first compound semiconductor layer, a second compound semiconductor layer and a third compound semiconductor layer are layered on a semiconductor substrate, and at least the second compound semiconductor layer comprises an Al-containing material;

etching the layered film by an etching method including at least wet etching thereby forming a three-dimensional structure having a sidewall portion in which the Al-containing material is exposed to at least part of the sidewall portion;

placing the semiconductor substrate formed with the three-dimensional structure in a crystal growing apparatus and cleaning the sidewall by introducing a halogen element-containing gas into the crystal growing apparatus; and burying, subsequently to the cleaning step, a region adjacent to the sidewall with a crystal-grown semiconductor material in the crystal growing apparatus.

2. A manufacturing method of a semiconductor optical device according to claim 1, wherein the semiconductor material is crystallographically grown in a region adjacent to the sidewall in the crystal grown apparatus subsequently to the cleaning, thereby joining the semiconductor film to the sidewall without deteriorating the crystallinity of the semiconductor film.

3. A manufacturing method of a semiconductor optical device according to claim 1, wherein the halogen-containing gas is introduced into the crystal growing apparatus without being excited by an electromagnetic field while keeping the semiconductor substrate at a predetermined temperature, thereby cleaning the sidewall.

4. A manufacturing method of a semiconductor optical device according to claim 1, wherein the halogen element is chlorine.

5. A manufacturing method of a semiconductor optical device according to claim 1, wherein the first compound semiconductor layer is used as a cladding layer and the second semiconductor compound semiconductor layer is used as an active layer, and the three-dimensional structure in a stripe structure.

6. A manufacturing method of a semiconductor optical device according to claim 1, wherein the layered film comprises a cladding layer and an active layer, which serve as a first core layer, the three-dimensional structure has a stripe structure, and in the crystal growing apparatus, a semiconductor material at least containing an InGaAlAs type material is crystallographically grown on the surface of the semiconductor substrate adjacent to the sidewall subsequently to the cleaning, thereby forming a first core layer and a second core layer having a composition different from that of the first core layer so that one end thereof is joined with a boundary of the sidewall and the other end thereof extends in a light propagating direction.

7. A manufacturing method of a semiconductor optical device according to claim 1, wherein the layered film comprises the first compound semiconductor layer as a multiplication layer, the second compound semiconductor layer as an electric field moderation layer, and the third compound semiconductor layer as a light absorption layer, and the three-dimensional structure has a mesa-shaped structure.

8. A manufacturing method of a semiconductor optical device according to claim 1, wherein the second compound semiconductor layer comprises an InGaAlAs type material, and the manufacturing method further comprises the steps of:

forming gratings to a layer containing the second compound semiconductor layer by using an etching method at least including wet etching;

cleaning the surface of the gratings with a halogen element-containing gas in the crystal growing apparatus; and conducting crystal growing on the surface of the semiconductor substrate formed with the gratings in the crystal growing apparatus subsequently to the cleaning step, thereby burying the gratings in a semiconductor material.

9. A manufacturing method of a buried ridge type semiconductor optical device comprising the steps of:

forming a layered film in which a first cladding layer, an active layer, and a second cladding layer are layered on a semiconductor substrate at least the first cladding layer comprises an Al-containing material;

selectively etching a predetermined pattern region so as to decrease a thickness of the first cladding layer by using an etching method at least including wet etching, thereby forming a stripe structure having a sidewall in which the Al-containing material is exposed to part of the sidewall;

placing the semiconductor substrate formed with the stripe structure in a crystal growing apparatus, and introducing a halogen element-containing gas into the crystal growing apparatus, thereby cleaning the sidewall; and depositing a semiconductor film in a region adjacent to the sidewall in the crystal growing apparatus subsequently to the cleaning, thereby forming a semiconductor buried film in which the semiconductor film is joined with the sidewall without deteriorating crystallinity of the semiconductor film.

10. A manufacturing method for an optical element of an optical module comprising the steps of: forming a layered film in which a first compound semiconductor layer, a second compound semiconductor layer and a third compound semiconductor layer are layered on a semiconductor substrate, and at least the second compound semiconductor layer comprises an Al-containing material; etching the layered film by an etching method including at least wet etching thereby forming a three-dimensional structure having a sidewall portion in which the Al-containing material is exposed to at least part of the sidewall portion; placing the semiconductor substrate formed with the three-dimensional structure disposed in a crystal growing apparatus and cleaning the sidewall by introducing a halogen element-containing gas into the crystal growing apparatus, and burying, subsequently to the cleaning step, a region adjacent to the sidewall with a crystal-grown semiconductor material in the crystal growing apparatus wherein the optical element is mounted on at least a portion of the semiconductor substrate.

11. A manufacturing method for an optical element of an optical module according to claim 10, wherein the first compound semiconductor layer is used as a cladding layer and the second semiconductor compound semiconductor layer is used as an active layer, and the three-dimensional structure in a stripe structure is mounted on at least a portion of the semiconductor substrate.

12. A manufacturing method for an optical element of an optical module according to claim 10, wherein the layered film comprises a cladding layer and an active layer, which serve as a first core layer, the three-dimensional structure has a stripe structure, and in the crystal growing apparatus, a semiconductor material at least containing an InGaAlAs type material is crystallographically grown on the surface of the semiconductor substrate adjacent to the sidewall subsequently to the cleaning, thereby forming a first core layer and a second core layer having a composition different from that of the first core layer so that one end thereof is joined with a boundary of the sidewall and the other end thereof extends in a light propagating direction is mounted on at least a portion of the semiconductor substrate.

13. A manufacturing method for an optical element of an optical module according to claim 10, wherein the layered film comprises the first compound semiconductor layer as a multiplication layer, the second compound semiconductor layer as an electric field moderation layer, and the third compound semiconductor layer as a light absorption layer, and the three-dimensional structure has a mesa-shaped structure is mounted on at least a portion of the semiconductor substrate.

14. A manufacturing method for an optical element of an optical module according to claim 10, wherein the second compound semiconductor layer comprises an InGaAlAs type material, and the manufacturing method further comprises the steps of: forming gratings to a layer containing the second compound semiconductor layer by using an etching method at least including wet etching; cleaning the surface of the gratings with a halogen element-containing gas in a crystal growing apparatus; and conducting crystal growing on the surface of the semiconductor substrate formed with the gratings in the crystal growing apparatus subsequently to the cleaning step, thereby burying the gratings in a semiconductor material wherein in the semiconductor material is mounted on at least a portion of the semiconductor substrate.

15. A manufacturing method for an optical element of an optical module comprising the steps of: forming a layered film in which a first cladding layer, an active layer, and a second cladding layer are layered on a semiconductor substrate and at least the first cladding layer comprises an Al-containing material; selectively etching a predetermined pattern region so as to decrease a thickness of the first cladding layer by using an etching method at least including wet etching, thereby forming a stripe structure having a sidewall in which the Al-containing material is exposed to part of the sidewall; placing the semiconductor substrate formed with the stripe structure in crystal growing apparatus, and introducing a halogen element-containing gas into the crystal growing apparatus, thereby cleaning the sidewall; and depositing the semiconductor film in a region adjacent to the sidewall in the crystal growing apparatus subsequently to the cleaning, thereby forming a semiconductor buried film in which the semiconductor film is joined with the sidewall without deteriorating crystallinity of the semiconductor film wherein the semiconductor or film is mounted on at least a portion of the semiconductor substrate and wherein the optical element is mounted on at least a portion of the semiconductor substrate.

* * * * *